United States Patent [19]

Postlewait et al.

[11] Patent Number: 5,073,758
[45] Date of Patent: Dec. 17, 1991

[54] RESISTANCE MEASUREMENT IN AN ACTIVE AND HIGH TEMPERATURE ENVIRONMENT

[75] Inventors: Lester B. Postlewait; Charles M. Newton, both of Cheraw, S.C.

[73] Assignee: Cooper Industries, Inc., Houston, Tex.

[21] Appl. No.: 501,730

[22] Filed: Mar. 30, 1990

[51] Int. Cl.⁵ ............................................. G01R 27/08
[52] U.S. Cl. ................................... 324/713; 219/497; 324/602; 324/691
[58] Field of Search ............... 324/713, 718, 691, 693, 324/705, 707, 525, 602, 603, 612, 615; 219/497

[56] References Cited

U.S. PATENT DOCUMENTS

| | | | |
|---|---|---|---|
| 4,264,860 | 4/1981 | Thebault | 324/713 |
| 4,390,769 | 6/1983 | Steigerwald | 363/132 X |
| 4,498,044 | 2/1985 | Horn | 324/691 |
| 4,639,569 | 1/1987 | Dufrenne | 324/718 X |
| 4,963,830 | 10/1990 | Roth et al. | 324/713 X |

FOREIGN PATENT DOCUMENTS 0345473 12/1989 European Pat. Off. ............ 324/713

Primary Examiner—Kenneth A. Wieder
Assistant Examiner—Robert W. Mueller
Attorney, Agent, or Firm—Kenyon & Kenyon

[57] ABSTRACT

A circuit and method for measuring resistance in an active and high temperature environment is provided using a low frequency square wave as an input. The square wave input is fed through the unit under test into a full-wave rectifier and RMS circuit. The full-wave rectifier and averaging circuit cancel out errors caused by the Seebeck effect and noise. The resulting d.c. signal is proportional to the resistance of the unit under test and can be displayed.

21 Claims, 3 Drawing Sheets

RESISTANCE MEASUREMENT IN AN ACTIVE AND HIGH TEMPERATURE ENVIRONMENT

FIELD OF THE INVENTION

This invention relates to a method and apparatus for measuring resistance in an active, high temperature environment of an energized, hot soldering tip or similar tool.

BACKGROUND OF THE INVENTION

When using a soldering tool or other high temperature device it is sometimes necessary to measure resistance in the heated element (e.g., soldering tip). If the tip-to-ground resistance of a soldering tip increases, the likelihood of an electrostatic discharge between the soldering tip and the article being soldered also increases. This electrostatic discharge could damage the article being soldered, especially for active devices composed of CMOS, GaAs, or other semiconductor materials. Department of Defense specifications require that a maximum of 2 ohms resistance be allowed between the soldering tip and the ground connection of the energized soldering tool.

A known method for measuring resistance in a soldering tip or similar heated element requires the use of a standard d.c. current source and the measurement of the voltage from tip to ground. The magnitude of the resistance is then computed by dividing the measured voltage value by the magnitude of the current source. This method leads to several errors. Electrical noise, for example, generated in the hot soldering tip, will cause an increase in the measured voltage. This increase in voltage may have a magnitude of several millivolts a.c. Another error found in this environment is a thermocouple-type voltage that appears at the measurement junction, a phenomenon commonly known as the Seebeck effect. Depending upon the polarity of the Seebeck effect, voltage will be either added to or subtracted from the measured voltage.

In order to cancel the Seebeck effect in the prior art methods, the polarity of the current going through the soldering tip must be manually reversed and a second measurement of the voltage from tip to ground be made. The two measurements are then averaged, and the average value is divided by the magnitude of the current to compute the tip-to-ground resistance. This method is cumbersome and time-consuming. Also, the noise in the activated tip will still appear in the final resistance measurement. This method suffers from inefficiencies in time and accuracy in measuring resistance in an active, high temperature environment.

SUMMARY OF THE INVENTION

The invention described herein overcomes these problems by more accurately measuring resistance in an active, high temperature environment. This is accomplished by utilizing a unique measuring system in an active, high temperature environment. As described in connection with the preferred embodiment an alternating current (a.c.) signal is generated and is passed through the device being tested. A modified a.c. signal proportional to the resistance of the device being tested is generated and transmitted through an appropriate circuit to obtain a full-wave rectified signal. The full-wave rectified signal is then averaged over time to generate a direct current (d.c.) voltage having an amplitude proportional to the conductor resistance.

In a further development of the present invention, an oscillator circuit sends a controlling signal to a 2×1 multiplexer whose inputs are coupled to a positive and a negative voltage supply having the same magnitude. The output of the multiplexer is a square wave voltage signal which is fed to a bipolar current source that converts this square wave voltage signal into a square wave current signal. The output signal of the bipolar current source has a defined amplitude and is fed through the unknown resistance of the soldering tip to ground. The voltage that appears across the soldering tip to ground is sent to a buffer circuit. The signal is then fed to a true RMS or averaging circuit which includes a full-wave rectifier. The signal is full-wave rectified and averaged, thus cancelling out the noise and Seebeck effect voltages. The resulting d.c. signal is proportional to the actual resistance and can be displayed.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

Figure 1:
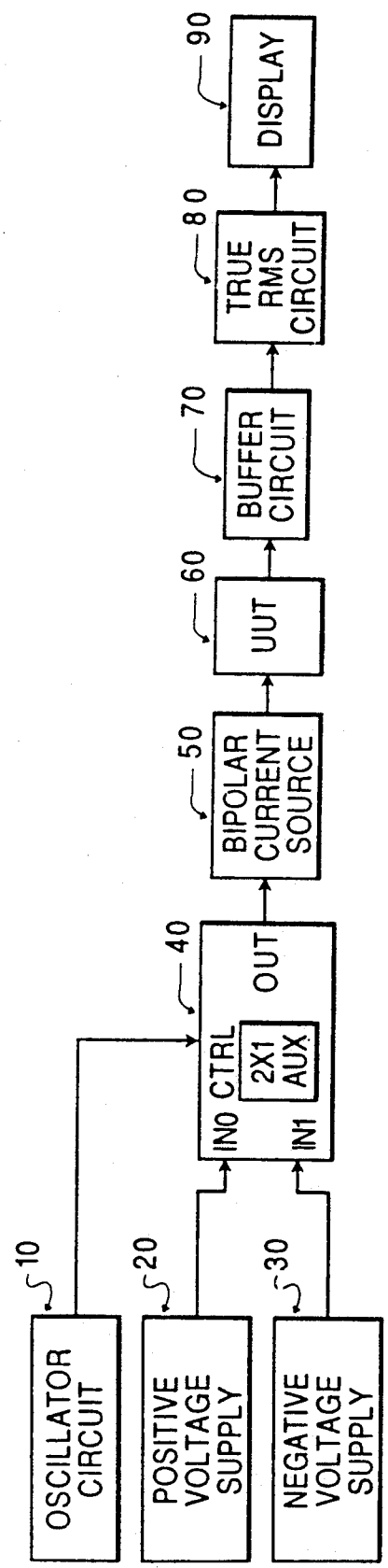
FIG. 1 is a block diagram of the circuit for measuring resistance constructed according to the present invention.

Referring to FIG. 1, an a.c. signal is provided by a generating circuit 10-50. The a.c. signal is then passed through the unit under test 60 which in this environment is an energized soldering tip. The unit under test 60 modifies the a.c. signal in such a way that the modified a.c. signal is proportional to the resistance of the unit under test 60. This modified a.c signal may contain noise and Seebeck errors. A true RMS circuit 80 removes these errors and outputs a d.c. signal proportional to the resistance of the unit under test 60. This d.c. signal can then be displayed at display 90.

Referring to FIG. 1, an oscillator circuit 10 provides an a.c. control signal for a multiplexer (MUX) 40. MUX 40 can be a 2×1 multiplexer having three inputs and one output. The first input of MUX 40 is coupled to a positive voltage supply 20 supplying a constant positive d.c. voltage. The second input of the MUX 40 is coupled to a negative voltage supply 30 supplying a constant negative d.c. voltage. This negative d.c. voltage can be of equal magnitude to that of the positive voltage supply 20. The control input of the MUX 40 is coupled to the oscillator circuit 10. The control signal of the oscillator circuit 10 causes the output of MUX 40 to alternate between the voltages supplied by the positive voltage supply 20 and the negative voltage supply 30.

The output of the MUX 40 is coupled to a bipolar current source 50. The bipolar current source 50 adjusts and refines the output voltage signal from MUX 40 and produces a square wave current signal. This a.c. current flows through the unit under test (UUT) 60. The UUT 60 in this case is a soldering iron or other similar resistive device or component. If the UUT is a soldering iron, the square wave current signal is transmitted through the soldering tip to ground, thus creating an a.c. voltage signal across the soldering iron to ground.

The a.c. voltage signal that appears across the soldering iron is amplified by a buffer circuit 70. The buffer circuit 70 is coupled to a true RMS circuit 80. The true RMS circuit 80 includes a full-wave rectifier and an averaging circuit. The true RMS circuit 80 full-wave rectifies the output voltage signal from the buffer circuit 70. This full-wave rectified signal is then averaged over time forming a d.c. voltage which is proportional to the resistance of the UUT 60. Full-wave rectifying and averaging the a.c. voltage signal cancels out the Seebeck and noise voltage errors. The true RMS circuit 80 is coupled to a display 90 which displays the resistance value of the UUT 60. This display 90 can be an LCD display which is well known in the art.

Figure 2:
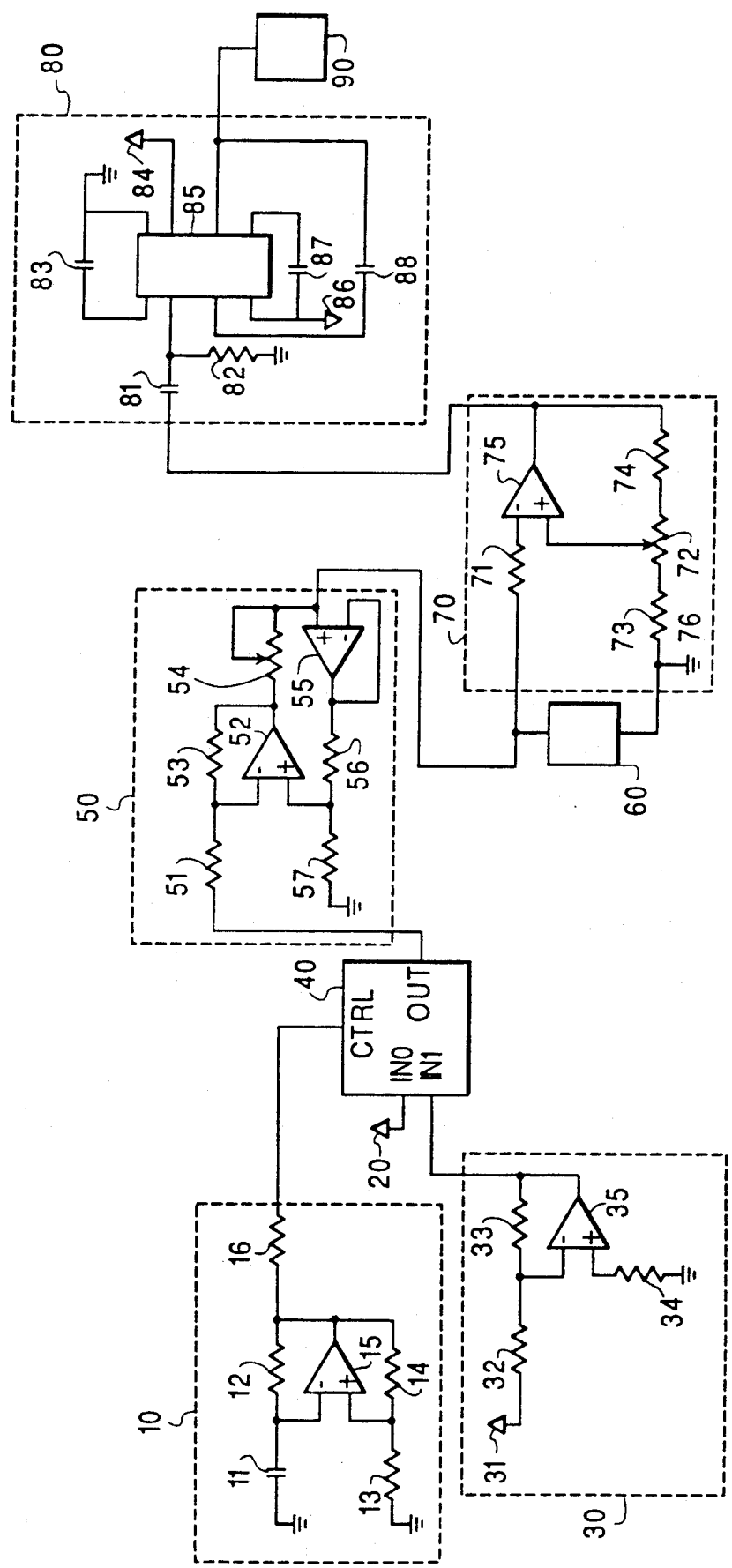
FIG. 2 is a detailed circuit diagram of the circuit for measuring resistance constructed according to the present invention.

Referring to FIG. 2, the circuit diagram for the device of the invention is shown. The oscillator circuit 10 includes an operational amplifier (op amp) 15. Op amps in this embodiment can be, but are not limited to, LM324AM op amps manufactured by National Semiconductor Corporation. A capacitor 11 is coupled between ground and the inverting terminal of the op amp 15. A resistor 12 is coupled between the inverting and output terminals of the op amp 15. A resistor 13 is coupled between ground and the non-inverting terminal of the op amp 15. Also, a resistor 14 is coupled between the non-inverting and output terminals of the op amp 15. The oscillator circuit 10 outputs a square wave voltage signal. The frequency of this square wave signal can be set to a desired value by choosing appropriate values for the capacitor and resistors of the oscillator circuit 10. A value B is computed from the resistances of resistor 13 (R13) and resistor 14 (R14) such that:

$$B = \frac{R13}{R13 - R14}$$

The period T of the output signal of the oscillator circuit 10 is computed from the value B as well as the resistance of resistor 12 (R12) and the capacitance of capacitor 11 (C11) such that $$T = 2(R12)(C11)\ln((1 - B)/(1 - B))$$

The frequency of the output signal of the oscillator circuit 10 is found by taking the reciprocal of the period T. In this embodiment, resistance and capacitance values should be chosen so that the frequency of this signal is on the order of 100 hertz. If the frequency is too high, the op amps in this circuit may cause errors in the square wave current that goes through the UUT 60. This in turn may cause errors in the final resistance value displayed. On the other hand, a frequency that is too low may cause errors in the true RMS circuit 80. A resistor 16 is coupled between the output terminal of op amp 15 and the control input of MUX 40.

MUX 40 can be, but is not limited to, a CD4053BCM multiplexer manufactured by National Semiconductor Corporation. The first input of MUX 40 is coupled to a positive d.c. voltage supply 20. In this embodiment a voltage between one and two volts is all that is necessary for this circuit. The second input of the MUX 40 is coupled to a negative d.c. voltage supply 30. The negative d.c. voltage supply 30 includes a positive d.c. voltage supply 31 which has the sam amplitude as the positive d.c. voltage supply 20. A resistor 32 is coupled between this positive d.c. voltage supply 31 and the inverting terminal of an op amp 35. Another resistor 33 is coupled between the inverting and output terminals of the op amp 35. A resistor 34 is coupled between ground and the non-inverting terminal of the op amp 35. The gain of this op amp circuit is computed from the resistances of resistor 32 (R32) and resistor 33 (R33) such that:

$$GAIN = -(R33/R32)$$

If the values R33 and R32 are equal, then the output of op amp 35 will be a negative voltage having an equal magnitude as the positive voltage source 31. Therefore, the voltage appearing at the second input of MUX 40 has the same magnitude as the positive voltage supply 20 but is opposite in sign.

The output of MUX 40 is coupled to a bipolar current source 50. The bipolar current source 50 includes a resistor 51 which is coupled between the output of MUX 40 and the inverting terminal of a first op amp 52. A resistor 53 is coupled between the inverting and output terminals of the first op amp 52. A potentiometer 54 is coupled between the output terminal of the first op amp 52 and the non-inverting terminal of the second op amp 55. The second op amp 55 serves as a follower in the bipolar current source 50. The output terminal and the inverting terminal of the second op amp 55 are coupled together. The output terminal of the second op amp 55 is coupled to a resistor 56. Resistor 56 is coupled to the non-inverting terminal of the first op amp 52. A resistor 57 is coupled between ground and the non-inverting terminal of the first op amp 52. The bipolar current source 50 converts the square wave voltage signal appearing at the output of MUX 40 into a square wave current signal. The amplitude of this square wave current can be set to a specific value by setting the potentiometer 54. In this embodiment, an amplitude of 10 mA is desired. The square wave current signal of the bipolar current source 50 appears at the non-inverting terminal of the second op amp 55 which is coupled to the unit under test (UUT) 60.

The square wave current signal passes through the UUT 60 to ground 76. A square wave voltage appears across the UUT 60 which is the input for a buffer circuit 70. The buffer circuit 70 includes a resistor 71 which is coupled to the non-inverting terminal of an op amp 75. The inverting terminal of op amp 75 is coupled to a potentiometer 72. A resistor 73 is coupled between ground 76 and the potentiometer 72. A resistor 74 is coupled between the potentiometer 72 and the output terminal of op amp 75. The gain of this buffer circuit can be set to a desired level by adjusting the potentiometer 72. The output terminal of op amp 75 is coupled to the input of the true RMS circuit 80.

The input of the true RMS circuit 80 is coupled to a capacitor 81 which blocks any d.c. voltage components present in the output voltage signal of the buffer circuit 70. The capacitor 81 is coupled to the input of an RMS averaging circuit 85. The RMS averaging circuit 85 can be, but is not limited to, an AD736JR True rms-to-dc Converter manufactured by Analog Devices. The RMS averaging circuit 85 includes a first op amp amplifier circuit (not shown) which is coupled to the capacitor 81. A resistor 82 is coupled between the capacitor 81 and the input of the RMS averaging circuit 85. This resistor 82 is also coupled to ground. The resistance of resistor 82 should be relatively high and only provides an external supply return.

The RMS averaging circuit 85 includes a full-wave rectifier circuit (not shown) which full-wave rectifies the input signal from capacitor 81. After the signal has been full-wave rectified, an RMS core element (not shown) of the RMS averaging circuit 85 averages the full-wave rectified signal over time and outputs a d.c. voltage. The magnitude of this d.c. voltage is proportional to the resistance appearing across the UUT 60 to ground.

A capacitor 83 is coupled between ground and the inverting terminal of the first op amp amplifier circuit (not shown) in the RMS averaging circuit 85. A capacitor 88 is coupled in parallel to a buffering circuit (not shown) in the RMS averaging circuit 85. Capacitors 83 and 88 refine the voltage signals appearing in the true RMS circuit 80 by removing high-frequency noise. A positive voltage source 84 and a negative voltage source 86 are used to power the RMS averaging circuit 85. A capacitor 87 is coupled in parallel to the RMS core element (not shown) of the RMS averaging circuit 85. This capacitor 87 is an averaging capacitor which is required by the AD736JR True rms-to-dc Converter to perform true RMS measurement. The negative voltage source 86 is coupled to this capacitor 87.

The output of the true RMS circuit 80 is coupled to a display 90. The display 90 can be, but is not limited to, an LCD display which is well-known in the art. A typical LCD display will multiply the amplitude of its input voltage by a known constant value and display this new value. The resistance in ohms from the UUT 60 to ground is computed by dividing the amplitude in volts of the d.c. voltage signal appearing at the output of the true RMS circuit 80 by the amplitude in amps of the square wave current appearing at the output of the bipolar current source 50. In this embodiment, the square wave current transmitted through the UUT 60 to ground has an amplitude of 10 mA. Therefore the resistance, in ohms, from the UUT 60 to ground is easily computed by multiplying the amplitude, in volts, of the d.c. voltage signal appearing at the output of the true RMS circuit 80 by 100. The potentiometer 72 of the buffer circuit 70 sets the gain of the buffer circuit 70. The gain of the buffer circuit 70 multiplied by the constant of the display 90 should equal 100.

Figure 3:
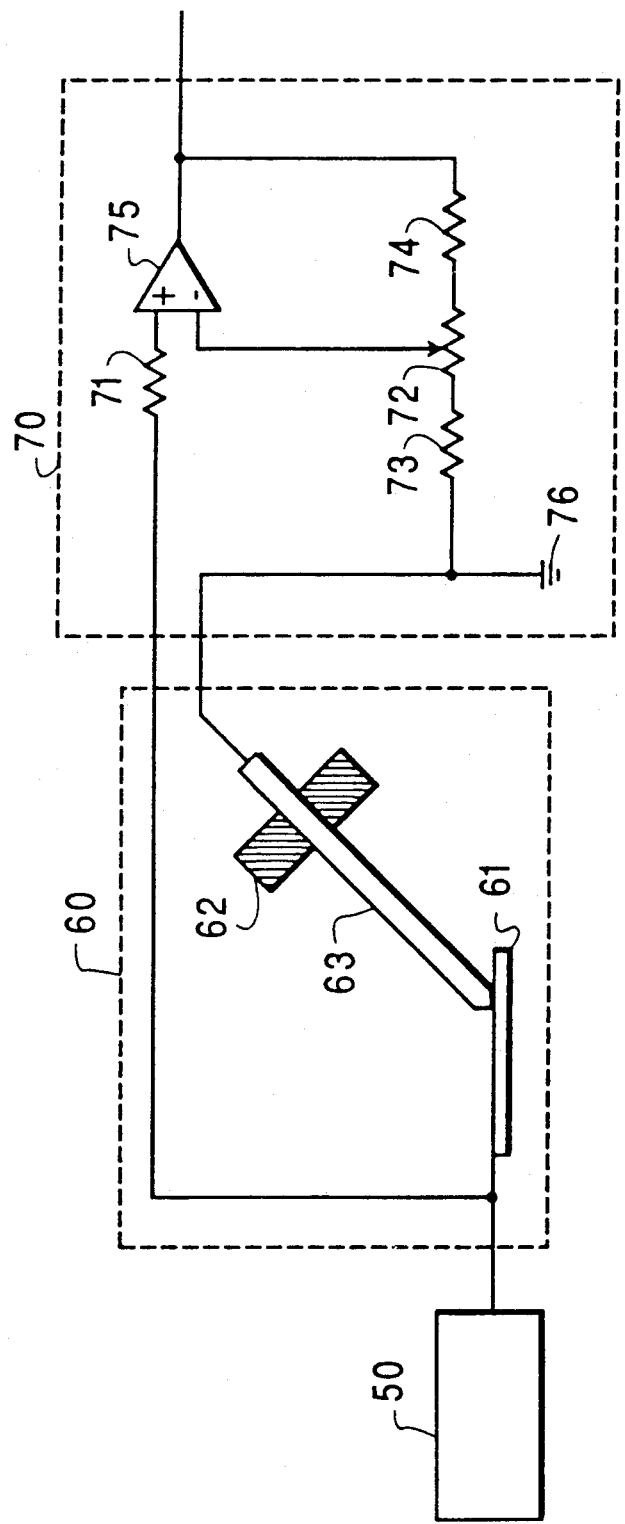
FIG. 3 is a detailed circuit diagram of the coupling of the unit under test with the bipolar current source and the buffer circuit constructed according to the present invention.

Referring to FIG. 3, the coupling of the UUT 60 to the rest of the circuit is shown. The device to be tested 63 (e.g. soldering tip) is coupled to a heating element 62. To measure the resistance from the device 63 to ground 76, the device 63 is placed in contact with a metal plate 61. The current signal from the bipolar current source 50 passes through the metal plate 61 and the device 63 to ground 76. A voltage signal then appears at the input of the buffer circuit 70 that is proportional to the resistance from the tip of the device 63 to ground 76. The voltage signal is then processed as was discussed in reference to FIG. 2.

The above is a detailed description of a particular embodiment of the invention. The full scope of the invention is set out in the claims that follow and their equivalents. Accordingly, the claims and specification should not be construed to unduly narrow the full scope of protection to which the invention is entitled.

What is claimed is:

1. A method for measuring the resistance of a part of a powered soldering iron, comprising:
   providing an a.c. signal;
   passing the a.c. signal through said part of the soldering iron to modify said a.c. signal;
   transmitting the modified a.c. signal through a full-wave rectifier to obtain a full-wave rectified signal; and
   averaging the full-wave rectified signal over time to generate a direct current signal having an amplitude which is proportional to the resistance of said part of the soldering iron.

2. The method of claim 1, wherein said providing step includes generating a square wave signal, said passing step includes passing the square wave signal through said conductor to modify said square wave signal, and said transmitting step includes transmitting the modified square wave signal through a full-wave rectifier to obtain a full-wave rectified signal.

3. The method of claim 1, wherein said providing step includes generating an a.c. signal by alternating between two d.c. signals.

4. The method of claim 3, wherein said generating an a.c. signal is done by electronically alternating between two d.c. signals.

5. The method of claim 1, wherein said providing step includes generating a current signal by forming an oscillating control signal, controlling a switch with said oscillating control signal, alternating the output of said switch between a first and a second d.c. voltage signal to form a square wave voltage signal, and converting said square wave voltage signal into said square wave current signal.

6. The method of claim 5, wherein said first d.c. voltage signal has an amplitude which is equal in magnitude and opposite in sign of the amplitude of the second d.c. voltage signal.

7. The method of claim 1, wherein said passing step includes passing the a.c. signal through an energized and hot soldering tip.

8. The method of claim 7, wherein said providing step includes generating a square wave current signal, and said passing step includes passing the square wave current signal through said soldering tip to form a square wave voltage signal.

9. The method of claim 1, further comprising: sending said direct current signal to a display.

10. The method of claim 1, wherein said soldering gun comprises a tip, a heating element, and a ground connection, and said part of the soldering iron is the connection between said tip, heating element, and ground connection.

11. The method of claim 1, wherein said rectifying and averaging steps compensate for the Seebeck effect.

12. A method for measuring the resistance of an energized and hot soldering tip, comprising:
    providing a square wave signal;
    passing the square wave signal through said soldering tip to modify said square wave signal;
    transmitting the modified square wave signal through a full-wave rectifier to obtain a full-wave rectified signal; and
    averaging the full-wave rectified signal over time to generate a d.c. signal having an amplitude which is proportional to resistance of said soldering tip.

13. A device for measuring the resistance of a part of a powered soldering iron environment, comprising:

a generating circuit for generating an a.c. signal, said generating circuit being coupled to said part of the soldering iron for passing said a.c. signal therethrough;

a full-wave rectifier for full-wave rectifying a modified a.c. signal, said full-wave rectifier being coupled to said part of the soldering iron; and an averaging circuit for averaging a full-wave rectified signal over time and generating a direct voltage signal having an amplitude which is proportional to the resistance of said part of the soldering iron, said averaging circuit being coupled to said full-wave rectifier.

14. The device of claim 13, wherein said generating circuit generates a square wave signal.

15. The device of claim 14, wherein said generating circuit generates a square wave current signal.

16. The device of claim 13, wherein said generating circuit comprises:

an oscillator circuit for forming an oscillating control signal;

a first d.c. voltage supply;

a second d.c. voltage supply;

a switch having at least three inputs, a first input is coupled to the first d.c. voltage supply, a second input is coupled to the second d.c. voltage supply, a third input which controls the output of said switch, said third input is coupled to said oscillator circuit, and said oscillation signal causes the output of said switch to alternate between said first and second inputs of said switch forming a square wave voltage signal; and a bipolar current source circuit for converting said square wave voltage signal into a square wave current signal.

17. The device of claim 16, wherein said first d.c. voltage supply has an amplitude which is equal in magnitude and opposite in sign to the amplitude of said second d.c. voltage supply.

18. The device 13, wherein said conductor is an energized and hot soldering tip.

19. The device of claim 13, further comprising:

a display device for displaying a value which is proportional to the amplitude of said direct current voltage signal, said value being equal to the amplitude of the resistance of said conductor.

20. The device of claim 13, wherein said soldering gun comprises a tip, a heating element, and a ground connection, and said part of the soldering iron is the connection between said tip, heating element, and ground connection.

21. The device of claim 13, wherein said rectifying and averaging steps compensate for the Seebeck effect.

* * * * *